United States Patent [19]
Takahashi et al.

[11] 3,959,791
[45] May 25, 1976

[54] DIGITAL DISPLAY SYSTEMS

[75] Inventors: Makoto Takahashi, Sagamihara; Osamu Ichihashi, Machida, both of Japan

[73] Assignee: Yashica Co., Ltd., Tokyo, Japan

[22] Filed: Mar. 27, 1974

[21] Appl. No.: 455,138

[52] U.S. Cl. ............................ 340/324 R; 324/133; 340/228 S; 340/248 A; 356/226
[51] Int. Cl.² .......................................... G08B 5/36
[58] Field of Search ......... 340/228 S, 248 B, 248 C, 340/324 R, 248 A, 248 C; 356/226; 324/133

[56] References Cited
UNITED STATES PATENTS

| | | | |
|---|---|---|---|
| 3,437,916 | 4/1969 | Mazurkevics | 340/248 B |
| 3,476,944 | 11/1969 | Odone | 356/226 |
| 3,597,095 | 8/1971 | Fukushima | 340/228 S |
| 3,724,955 | 4/1973 | Takahashi et al. | 356/226 |
| 3,765,006 | 10/1973 | Takahashi et al. | 356/226 X |
| 3,774,195 | 11/1973 | Schulthess et al. | 340/324 R |
| 3,794,430 | 2/1974 | Maida | 356/226 |

*Primary Examiner*—David L. Trafton
*Attorney, Agent, or Firm*—Charles W. Helzer

[57] ABSTRACT

In a digital display system of the type wherein a plurality of luminous display elements are selectively operated in accordance with the value of an analogue input signal, the driving circuit of the display elements is constructed such that one display element is operated in accordance with one predetermined level of the input signal, that another display element is operated in accordance with another predetermined level of the input signal and that said one and another display elements are operated simultaneously for the input signal having a level intermediate of said one predetermined level and said another predetermined level.

12 Claims, 9 Drawing Figures

| LED | 1 | 2 | 3 | 4 | ---- | n-2 | n-1 | n |
|---|---|---|---|---|---|---|---|---|
| $V_i < V_2$ | O | X | X | X | ---- | X | X | X |
| $V_2 < V_i < V_2'$ | O | O | X | X | ---- | X | X | X |
| $V_2' < V_i < V_3$ | X | O | X | X | ---- | X | X | X |
| $V_3 < V_i < V_3'$ | X | O | O | X | ---- | X | X | X |
| $V_3' < V_i < V_4$ | X | X | O | X | ---- | X | X | X |
| ⋮ | | | | | | | | |
| $V_{n-1} < V_i < V_{n-1}'$ | X | X | X | X | ---- | O | O | X |
| $V_{n-1}' < V_i < V_n$ | X | X | X | X | ---- | X | O | X |
| $V_n < V_i$ | X | X | X | X | ---- | X | X | O |

FIG. 1A
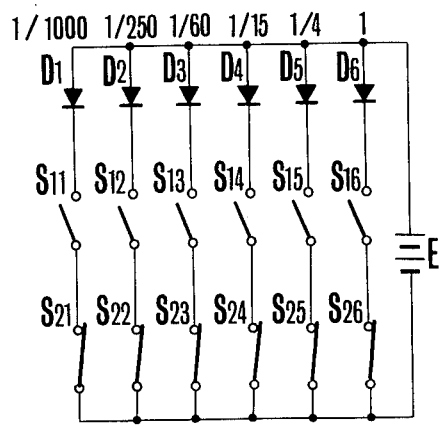
FIG. 1B
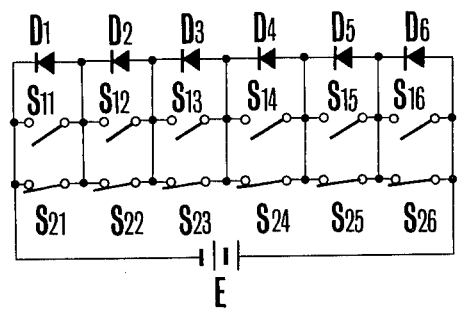
FIG. 5
| LED | 1 | 2 | 3 | 4 | --- | n-2 | n-1 | n |
|---|---|---|---|---|---|---|---|---|
| $V_i < V_2$ | ○ | × | × | × | --- | × | × | × |
| $V_2 < V_i < V_2'$ | ○ | ○ | × | × | --- | × | × | × |
| $V_2' < V_i < V_3$ | × | ○ | × | × | --- | × | × | × |
| $V_3 < V_i < V_3'$ | × | ○ | ○ | × | --- | × | × | × |
| $V_3' < V_i < V_4$ | × | × | ○ | × | --- | × | × | × |
| ⋮ | | | | | | | | |
| $V_{n-1} < V_i < V_{n-1}'$ | × | × | × | × | --- | ○ | ○ | × |
| $V_{n-1}' < V_i < V_n$ | × | × | × | × | --- | × | ○ | × |
| $V_n < V_i$ | × | × | × | × | --- | × | × | ○ |

FIG. 2

| | Dn | | | | | | SHUTTER SPEED | S1n | | | | | | S2n | | | | | |
|---|---|---|---|---|---|---|---|---|---|---|---|---|---|---|---|---|---|---|---|
| | D1 | D2 | D3 | D4 | D5 | D6 | | S11 | S12 | S13 | S14 | S15 | S16 | S21 | S22 | S23 | S24 | S25 | S26 |
| | O | X | X | X | X | X | 1/1000 | O | X | X | X | X | X | O | O | O | O | O | O |
| | O | O | X | X | X | X | 1/500 | O | O | X | X | X | X | O | O | O | O | O | O |
| | X | O | X | X | X | X | 1/250 | O | O | X | X | X | X | X | O | O | O | O | O |
| | X | O | O | X | X | X | 1/125 | O | O | O | X | X | X | X | O | O | O | O | O |
| | X | X | O | X | X | X | 1/60 | O | O | O | X | X | X | X | X | O | O | O | O |
| | X | X | O | O | X | X | 1/30 | O | O | O | O | X | X | X | X | O | O | O | O |
| | X | X | X | O | O | X | 1/15 | O | O | O | O | X | X | X | X | X | O | O | O |
| | X | X | X | X | O | X | 1/8 | O | O | O | O | O | X | X | X | X | O | O | O |
| | X | X | X | X | O | O | 1/4 | O | O | O | O | O | O | X | X | X | X | O | O |
| | X | X | X | X | X | O | 1/2 | O | O | O | O | O | O | X | X | X | X | O | O |
| | X | X | X | X | X | O | 1 | O | O | O | O | O | O | X | X | X | X | X | O |

FIG. 3

| D1 | D2 | D3 | D4 | D5 | D6 | SHUTTER SPEED | S11 | S12 | S13 | S14 | S15 | S16 | S21 | S22 | S23 | S24 | S25 | S26 |
|---|---|---|---|---|---|---|---|---|---|---|---|---|---|---|---|---|---|---|
| O | X | X | X | X | X | 1/1000 | X | X | X | X | X | X | X | O | O | O | O | O |
| O | O | X | X | X | X | 1/500 | X | X | X | X | X | X | X | X | O | O | O | O |
| X | O | X | X | X | X | 1/250 | O | X | X | X | X | X | X | X | O | O | O | O |
| X | O | O | X | X | X | 1/125 | O | X | X | X | X | X | X | X | X | O | O | O |
| X | X | O | X | X | X | 1/60 | O | O | X | X | X | X | X | X | X | O | O | O |
| X | X | O | O | X | X | 1/30 | O | O | X | X | X | X | X | X | X | X | O | O |
| X | X | X | O | X | X | 1/15 | O | O | O | X | X | X | X | X | X | X | X | O |
| X | X | X | O | O | X | 1/8 | O | O | O | X | X | X | X | X | X | X | X | O |
| X | X | X | X | O | X | 1/4 | O | O | O | O | X | X | X | X | X | X | X | O |
| X | X | X | X | O | O | 1/2 | O | O | O | O | O | X | X | X | X | X | X | X |
| X | X | X | X | X | O | 1 | O | O | O | O | O | X | X | X | X | X | X | X |

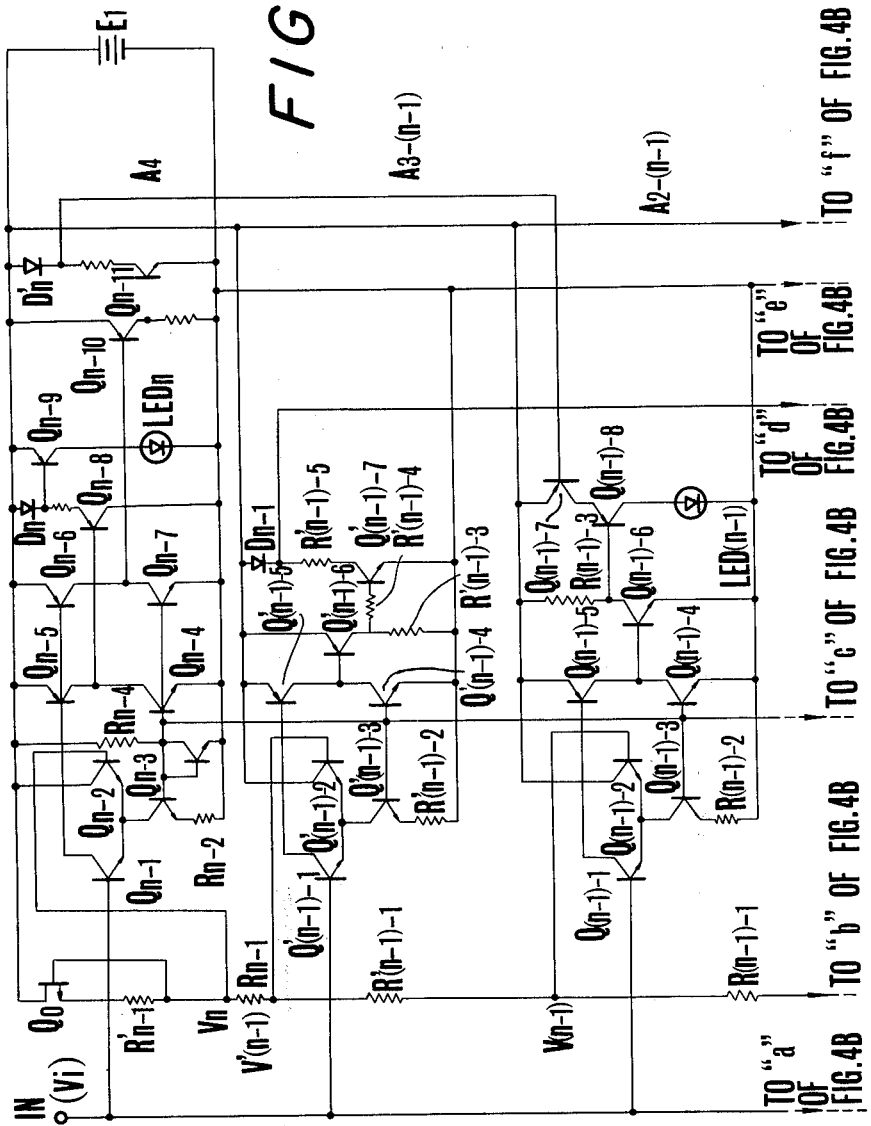

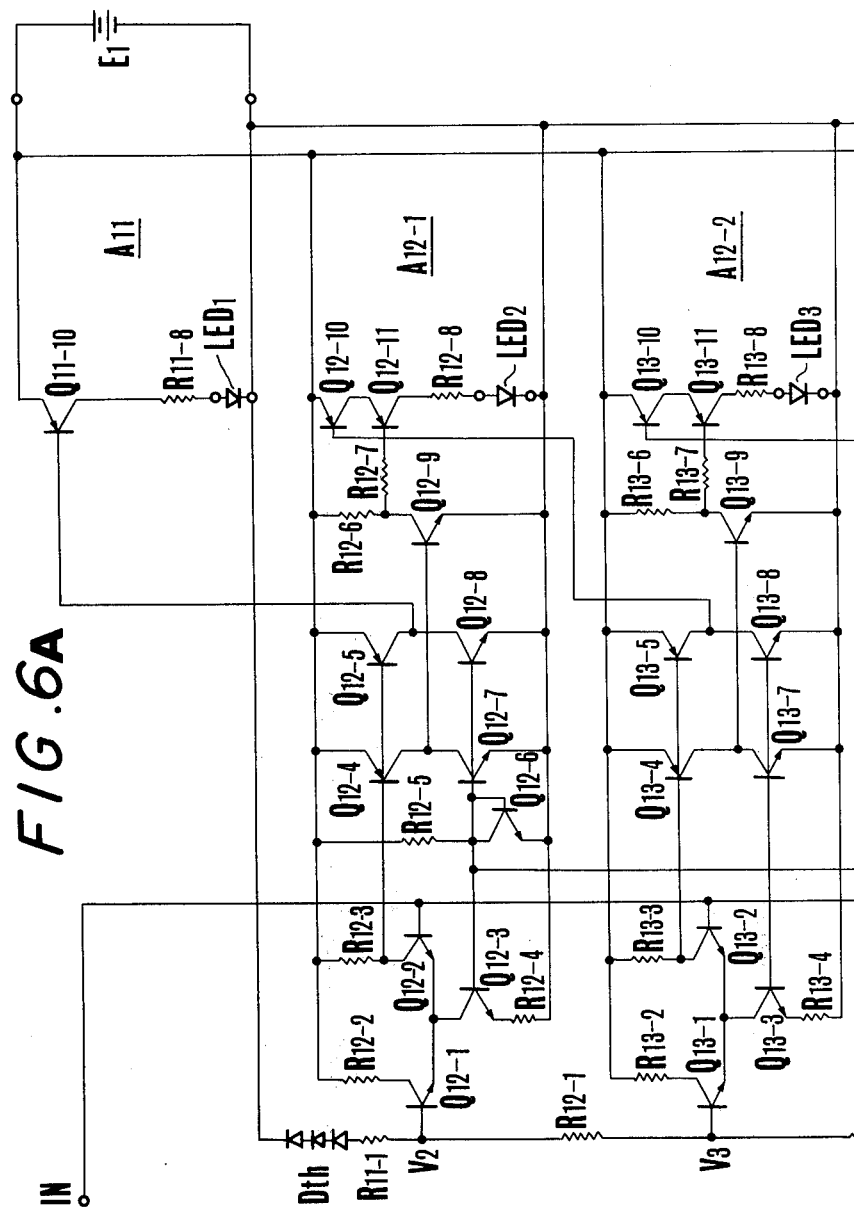

DIGITAL DISPLAY SYSTEMS

BACKGROUND OF THE INVENTION

This invention relates to a digital display system, more particularly to a display system in which an analogue input information is displayed digitally.

To make their use foolproof, recent photographic cameras are provided with means for automatically determining the degree of light exposure. For example such an automatic camera is provided with means for determining the shutter speed or the size of the opening of an irris diaphragm in accordance with information provided by a photoelectric conversion element, and means for displaying such conditions.

However, since known display means usually employ moviing coil type indicating meters, they are adversely effected by vibrations or shocks and their characteristics deteriorate with passing years so that the accuracy and stability of such prior art display means have not been satisfactory.

To solve these problems it has been proposed to incorporate a luminous element such as a luminous diode or a liquid crystal element in the finder of a camera. Although such elements are not affected by vibrations or shocks and can preserve the desired accuracy and stability because there is no movable element, they can operate only digitally. However, when the number of digits to be displayed increases it is difficult to dispose so many digits in a narrow space available in the finder. For example, the shutter speed is usually displayed in terms of 1/1000, 1/500, 1/250, 1/125, 1/60, 1/30, 1/15, 1/8, 1/4, 1/2 and 1 sec. To dispaly this many shutter speeds, it is necessary to provide many display elememts, one for each speed, in the finder. It is not only difficult to install this many display elements in a narrow space but also necessary to use a large number of driving circuits, thus complicating the construction and increasing the cost of manufacture.

SUMMARY OF THE INVENTION

It is an object of this invention to provide an improved digital display system having compact and rugged construction suitable for use in precision cameras and the like machines.

Another object of this invention is to provide an improved digital display system capable of displaying a large quantity of analogue information with fewer numbers of luminous display elements than is possible with prior art display systems. According to this invention, there is provided a digital display system of the type wherein a plurality of luminous display elements are selectively operated in accordance with the value of an analogue input signal. The improved display system is by the feature wherein the driving circuit of the display element is constructed such that one display element is operated in accordance with one predetermined level of an input signal, another display element is operated in accordance with another predetermined level of an input signal and that both said one and another display elements are operated simultaneously by an input signal having a level intermediate of said one predetermined level and said another predetermined level.

BRIEF DESCRIPTION OF THE DRAWINGS

In the accompanying drawings:

FIGS. 1a and 1b show simplified electrical connection utilized to explain the principle of this invention;

FIGS. 2 and 3 show charts to explain the operation of various elements shown in FIGS. 1a and 1b;

FIGS. 4A and 4B in combination show a connection diagram of one embodiment of this invention;

FIG. 5 is a chart showing the operation of display elements shown in FIG. 4, and FIGS. 6A and 6B in combination show a connection diagram showing a modified embodiment of this invention.

DESCRIPTION OF THE PREFERRED EMBODIMENTS

Figure 4B:
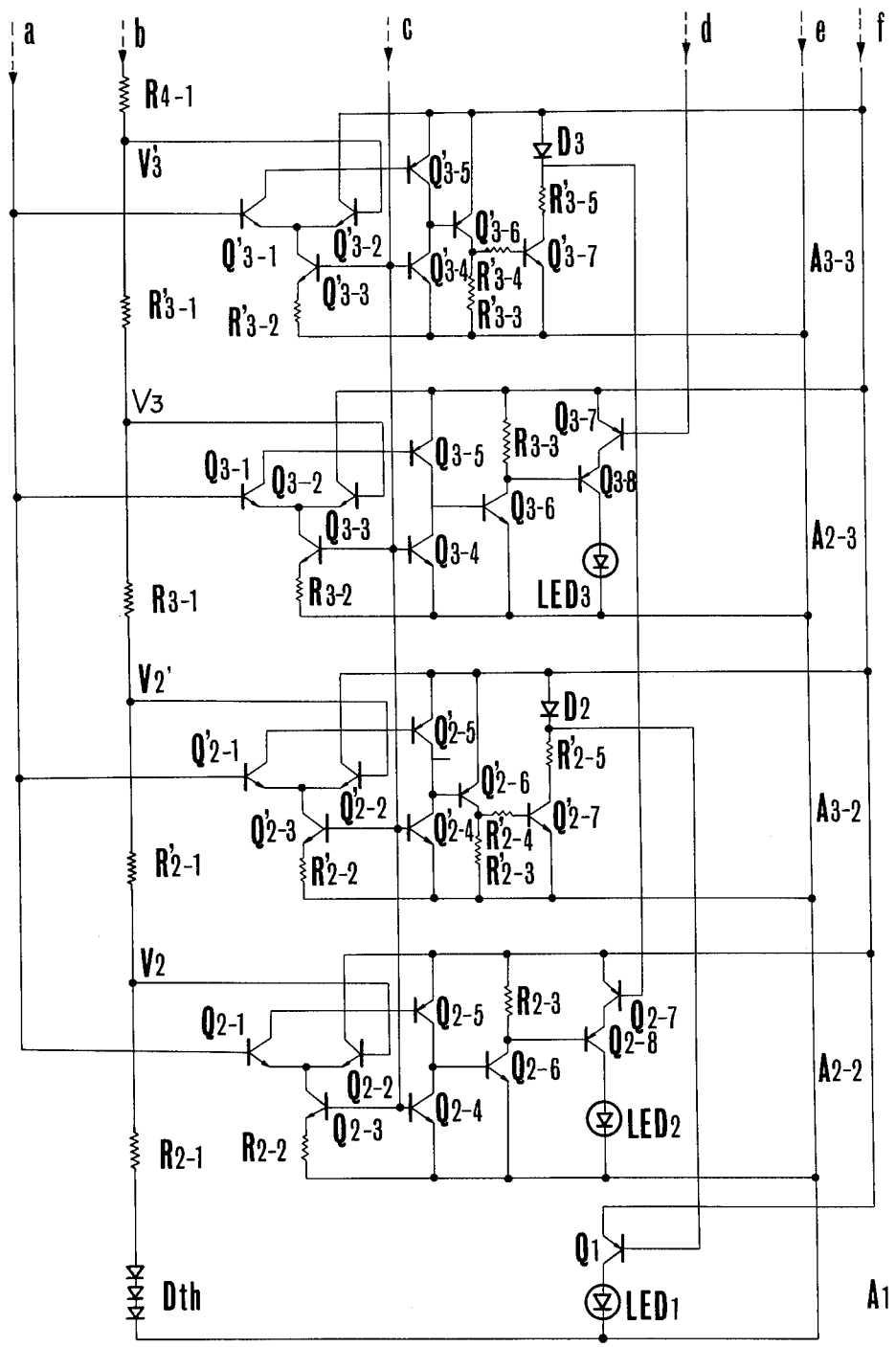

Referring now to FIGS. 1a and 1b which show the principle of the digital display system of this invention, there are provided a number of normal open switches $S_{11}$ through $S_{16}$ which are closed when an input signal reaches a predetermined value, a number of noramlly closed switches $S_{21}$ through $S_{26}$ which are opened when the iput signal reaches a predetermined value, a number of luminous diodes $D_1$ through $D_6$ utilized to display shutter speeds of 1/1000, 1/250, 1/60, 1/15 and 1 sec. respectively, and a DC. source E. In FIG. 1A, each luminous diode is connected in series circuit relationship with one of the switches $S_{11}$ through $S_{16}$ and one of the switches $S_{21}$ through $S_{26}$, and these series circuits are connected in parallel across the source E. In FIG. 1B, each luminous diode is connected in parallel with one of the switches $S_{11}$ through $S_{16}$ and one of the switches $S_{21}$ through $S_{26}$ and the three series circuits comprising $D_1$ through $D_6$, the series circuit comprising switches $S_{11}$ through $S_{16}$ and the series circuits comprising switches $S_{21}$ through $S_{26}$, respectively, are connected in parallel across the source E.

In the case of FIG. 1A, two groups of switches $S_{11}$ through $S_{16}$ and $S_{21}$ through $S_{26}$ are closed as shown in FIG. 2 by an input signal having a magnitude determined by such factors as the brightness of the object, the size of the irris opening, the ASA value of the film used for operating the diodes. In FIG. 2, small circles show the closed states of the switches, and the operated states of the diodes.

For example, when the input signal has a voltage corresponding to 1/1000 sec. shutter speed, switches $S_{11}$ and switches $S_{21}$ through $S_{26}$ are closed whereas swithes $S_{12}$ through $S_{16}$ are opened. Accordingly, a circuit through diode $D_1$ and switches $S_{11}$ and $S_{21}$ is closed across the source E to luminesce the luminous diode $D_1$ thereby displaying shutter speed 1/1000 sec. When the input signal denotes information corresponding to 1/250 sec. shutter speed, diode $D_2$ luminesces to display shutter speed 1/250 sec. When the value of the input signal corresponds to 1/500 sec, switches $S_{11}$, $S_{12}$, $S_{21}$ through $S_{26}$ are closed while switches $S_{13}$ through $S_{16}$ are opened. Consequently, the closed circuits for energizing luminous elements $D_1$ and $D_2$ are simultaneously established to luminesce luminous diode $D_1$ for displaying 1/1000 sec. shutter speed and luminous diode $D_2$ for displaying 1/125 sec. shutter speed.

Concurrent operation of luminous diodes $D_1$ and $D_2$ for displaying two shutter speeds means an intermediate shutter speed of 1/500 sec. In the case of FIG. 1B closing switches $S_{11}$ through $S_{16}$ and $S_{21}$ through $S_{26}$ according to FIG. 3 it is possible to luminesce one or more diodes in the same manner as in FIG. 1a. For example, when the input signal corresponds to a shutter speed of 1/60 sec., switches $S_{11}$, $S_{12}$, $S_{24}$ through $S_{26}$ are closed whereas switches $S_{13}$ through $S_{16}$ and $S_{21}$ through $S_{23}$ are opened. Then a closed circuit extending through switches $S_{26}$, $S_{25}$ and $S_{24}$, luminous diode $D_3$ and switches $S_{12}$ and $S_{11}$ is established across source E to luminesce only the luminous diode $D_3$, thus displaying the shutter speed of 1/60 sec. When the input signal corresponds to a shutter speed of 1/30 sec, switches $S_{11}$, $S_{12}$, $S_{25}$ and $S_{26}$ are closed and switches $S_{13}$ through $S_{16}$ and $S_{21}$ through $S_{24}$ are opened to luminesce luminous diode $D_3$ displaying shutter speed of 1/60 sec. and luminous diode $D_4$ displaying shutter speed of 1/15 sec. From this it can be noted that shutter speed 1/30 is displayed.

FIGS. 4A and 4B in combination show a connection diagram of one embodiment of this invention corresponding to FIG. 1A which comprises an input terminal IN to which an input signal Vi is impressed, amplifiers $A_1$, $A_{2-2}$ through $A_{2-(n-1)}$, $A_{3-2}$ through $A_{3-(n-1)}$ and $A_4$, a DC source $E_1$, luminous diodes $LED_1$ through $LED_n$, resistors R, diodes D and transistors Q.

The voltage of the source $E_1$ is applied across a series circuit, for passing a constant current, which includes transistor $Q_o$, potentiometer resistors $R'_{n-1}$, $R_{n-1}$, $R_{(n-1)-1}$ ... $R'_{2-1}$, $R_{2-1}$ and a temperature compensation diode $D_{th}$ to form reference voltages $V_2$, $V_2'$, $V_3$, $V_3'$ ... $V_{(n-1)}$, $V'_{(n-1)}$, $V_n$. The values of various potentiometer resistors are selected such that these reference voltages correspond to respective shutter speeds. For example, if the intensities of the light are logrithmically compressed by the action of a shutter circuit, the difference between adjacent stages of the potentiometer would be equal so that the values of respective potentiometer resistors are selected to produce equal voltage drop across each resistor.

There are four types of amplifiers $A_1$, $A_2$, $A_3$ and $A_4$. Of these amplifiers $A_{2-k}$, $A_{3-k}$ ($k=2\sim (n-1)$) respectively include transistors $Q_{k-1}$, $Q_{k-2}$ and $Q'_{k-1}$, $Q'_{k-2}$ which constitute a differential amplifier before each amplifier, and amplifier $A_4$ includes transistors $Q_{n-1}$ and $Q_{n-2}$. One of the reference voltages is applied to one input of each differential amplifier and said input signal Vi is applied to the other input. Amplifier $A_1$ is connected to always luminesce luminous diode $LED_1$ whenever the source voltage is applied whereas amplifier $A_4$ is connected to luminesce luminous diode $LED_n$ when the input signal level exceeds a reference voltage $V_n$. On the other hand, amplifiers $A_2$ and $A_3$ operate at intermediate levels of the input signal. For example, with reference to amplifier $A_3$, then $k = 3$ and where there is no offset voltage in the differential amplifier comprised by transistors $Q'_{k-1}$, $Q'_{k-2}$ and $Q'_{k-3}$, whenever an input signal having a voltage larger than a reference voltage $V'_k$ is applied to input terminal IN, transistor $Q'_{k-1}$ will become conductive. Where the voltage of the input signal is lower than a reference voltage $V'_k$, transistor $Q'_{k-1}$ will not turn-ON because transistor $Q'_{k-2}$ is ON. Consequently, transistor $Q'_{k-5}$ is OFF, transistors $Q'_{k-6}$ and $Q'_{k-7}$ are ON. The purpose os resistor $R'_{k-5}$ is to limit the collector current of transistor $Q'_{k-7}$ and diode $D_k$ is used to control the base potential of transistor $Q_{(k-1)-7}$.

This connection controls the collector current of transistor $Q_{(k-1)-8}$ to be at a constant value, so that transistor $Q_{(k-1)-8}$ is rendered ON and luminesces diode $LED_2$. When the voltage of the input signal exceeds a reference voltage $V'_k$, transistor $Q'_{k-1}$ is rendered ON which ultimately renders OFF transistors $Q'_{k-7}$ and $Q_{(k-1)-7}$ and diode $LED_2$.

Turning now to amplifier $A_2$, then $k = 2$ and where the voltage of the input signal is lower than the reference voltage $V_k$, in the same manner as has been described in connection with amplifier $A_3$, transistor $Q_{k-1}$ is rendered OFF, and transistor $Q_{k-5}$ OFF, however, transistors $Q_{k-6}$ and $Q_{k-8}$ are maintained OFF, with the result that luminous diode $LED_k$ will not be energized. As the signal voltage exceeds the reference voltage $V_k$ transistor $Q_{k-1}$ is rendered ON which ultimately renders ON transistor $Q_{k-8}$. If, at this time, transistor $Q_{k-7}$ is ON, the luminous diode $LED_k$ will be energized. As the signal voltage exceeds a reference voltage $V'_{(k+1)}$, transistor $Q_{k-7}$ is rendered OFF, thus deenergizing luminous diode $LED_k$.

Amplifier $A_4$ is constructed such that whenever the signal voltage exceeds a reference voltage $V_n$, it causes luminous diode $LED_n$ to luminesce and that it causes diode $D'_n$ to generate a signal that deenergizes luminous diode $LED_{(n-1)}$. Because of the operations of amplifiers $A_1$ to $A_4$ described above, luminous diodes $LED_1$ through $LED_n$ are operated in the following manner in accordance with the voltage value of the input signal.

More particularly, where the signal voltage Vi is smaller than a reference voltage $V_2$, that is $Vi<V_2$, only the luminous diode $LED_1$ is operated. This condition is utilized to display that such a small voltage is outside of the range of operation of an electric eye or to display a long time shutter operation. Under a condition of $V_2<Vi<V'_2$, luminous diodes $LED_1$ and $LED_2$ are operated, and under a condition $V'_2<Vi<V_3$, transistor $Q'_{2-7}$ is rendered OFF to deenergize luminous diode $LED_1$ so that only luminous diode $LED_2$ is energized. In this manner, as the signal voltage varies gradually, the condition of energizing the luminous diodes is varied such that, luminous diodes $LED_2$ and $LED_3$ are energized, only diode $LED_3$ is energized, diodes $LED_3$ and $LED_4$ are energized, and only diode $LED_4$ is energized and so on. Finally, when the signal voltage Vi exceeds reference voltage Vn, that is Vi>Vn, only the luminous diode $LED_n$ is energized. This condition is used to display that the input voltage is outside of the operating range of an electric eye or to display a high speed shutter operation.

The operations of various luminous diodes $LED_1$ through $LED_n$ when the signal voltage Vi varies in a manner just described are shown in FIG. 5.

When a plurality of amplifiers are connected in parallel with respect to the iput signal as in this embodiment, the brightness of one of the luminous diodes $LED_1$ through $LED_n$ does not interfere with the brightness of the other.

Figure 6B:
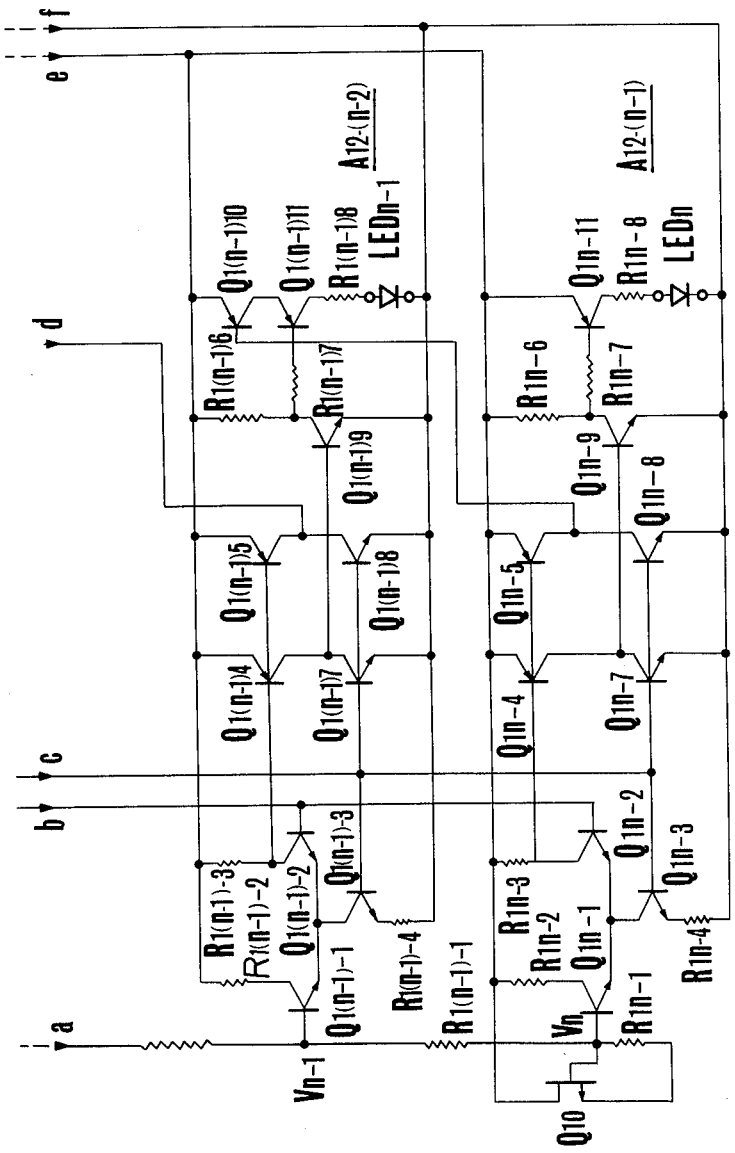

In a modified embodiment shown in FIGS. 6A and 6B in combination two types of amplifiers are used to control the operation of luminous diodes in the same manner as in FIGS. 4A and 4B. The circuit shown in FIGS. 6A and 6B comprises a plurality of amplifiers $A_{11}$, and $A_{12-(k-1)}$ (where $k=2\sim n$), plurality of resistors R, diodes D and transistors Q. Transistors $Q_{1k-1}$ and $Q_{1k-2}$ cooperate to constitute a portion of a differential amplifier and the output thereof is amplified by transistors $Q_{1k-4}$ and $Q_{1k-5}$, the outputs thereof being coupled to the inputs of transistors $Q_{1k-9}$ and $Q_{1(k-1)-10}$, respectively. The output of transistor $Q_{1k-9}$ is applied to the input of transistor $Q_{1k-11}$ via a resistor $R_{1k-7}$, and the output of transistor $Q_{1(k+1)-5}$ is applied to the input of transistor $Q_{1k-10}$. The values of resistors $R_{1k-1}$ which constitute a potentiometer are selected to apply reference voltages $V_k$ corresponding to various shutter speeds.

With the circuit constructed as described above, when the signal voltage Vi is smaller than a reference voltage $V_2$, then $k = 2$ and transistor $Q_{1k-1}$ is rendered ON, whereas transistor $Q_{1k-2}$ is OFF so that both transistors $Q_{1k-4}$ and $Q_{1k-5}$ are rendered OFF. Consequently, transistors $Q_{1k-7}$ and $Q_{1k-11}$ are rendered OFF, thereby turning ON transistor $Q_{1(k-1)-11}$. Consequently, luminous diode LED($k-1$) does luminesce but luminous diode $LED_k$ does not luminesce. As the signal voltage increases, transistor $Q_{1k-2}$ turns ON so that transistors $Q_{1k-4}$ and $Q_{1k-5}$ are rendered ON, transistors $Q_{1k-9}$ and $Q_{1k-11}$ ON while transistor $Q_{1(k-1)-10}$ OFF. Accordingly, luminous diode LED $k-1$ does not luminesce but $LED_k$ is caused to luminesce. In this manner, luminous diodes are sequentially energized in the same manner as in FIGS. 4A and 4B as the signal voltage Vi increases.

It should be understood that the invention is not limited to the specific embodiments described above and that many changes and modifications may be made.

For example, instead of using luminous diodes, it is also possible to use such luminous display elements as incandescent lamps and liquid crystal elements.

Further, the level of the intermediate zone of the reference display level was fixed but it may be variable.

Further, instead of a photographic camera, the invention can also be applived to any system where it is desired to display analogue input information.

As described hereinabove, the invention provides a novel display system capable of digitally displaying a plurality of analogue input information signals by using dispaly elements of the number of only one half of that required in the prior art digital display systems, thus decreasing the display size. Accordingly, when compared with a prior art systems utilizing indicating meters for use in photographic cameras, the display system can be fabricated in a compact and rugged construction which is free from troubles because there is no movable component. Hence, the novel digital display system is suitable for use to dispaly the shutter speed and degree of opening of the irris diaphragm of a camera and other precision machines.

What is claimed is:

1. In a digital display system of the type wherein a plurality of n luminous display elements are arranged in an orderly manner for selective operation in accordance with the value of an analogue input signal and where $n$ is an integer equal to or greater than three (3); the improvement which comprises means for operating each of said display elements in response to a unique predetermined level of said analogue input signal, means for simultaneously operating display elements between the first and the nth element in response to a plurality of intermediate levels of said analogue input signal between said predetermined unique levels, each of said display elements between the first and nth display elements being responsive to three different values of the analogue input signal, said three different values of the analogue input signal providing a first display by a single display element at a predetermined unique level of the analogue input signal, a second display by a combination of said single display element with an adjacent display element at an intermediate level of said analogue input signal less than said predetermined unique level, and a third display by another combination of said single display element with an adjacent display element at an intermediate level of said analogue input signal greater than said predetermined unique level, and said first and nth display elements being responsive both to their respective predetermined unique level of the analogue input signal and to an intermediate level of said analogue input signal greater than and less than their predetermined unique levels, respectively.

2. The digital display system according to claim 1 which further includes means for normally operating at least one display element irrespective of the level of said analogue input signal.

3. The display system according to claim 1 wherein said luminous display elements comprise luminous diodes.

4. The display system according to claim 1 wherein said luminous display elements comprise incandescent lamps.

5. The display system according to claim 1 wherein said luminous display elements comprise liquid crystal elements.

6. The display system according to claim 1 wherein said display system is for use with a photographic camera and said analogue input signal is proportional to the shutter speed setting of the photographic camera.

7. The display system according to claim 1 wherein said display system is for use with a photographic camera and said analogue input signal is proportional to the iris disphragm setting of the camera.

8. The display system according to claim 1 wherein said display system is for use with a photographic camera and said analogue input signal is proportional to the shutter speed setting and the iris diaphragm setting of the camera.

9. A circuit arrangement for digital display of an analogue input signal comprising an input terminal, a source of voltage, a voltage divider circuit across said source of voltage for deriving a plurality of reference voltages, first amplifier circuit means for energizing a luminous display element included therein upon the level of the analogue input signal falling below a predetermined value, a plurality of second amplifier circuit means each having differential amplifier means having one input connected to said input terminal and other input connected to a juncture of said voltage divider circuit at a predetermined reference voltage and a respective luminous display element, a plurality of third amplifier circuit means each having differential amplifier means having one input connected to said input terminal and other input connected to another juncture of said voltage divider circuit at another predetermined reference voltage, said luminous display element of an adjacent second amplifier circuit means being energized upon the level of the input signal exceeding the predetermined reference voltage assigned to the last mentioned second amplifier circuit means and deenedegized upon the level of the input signal exceeding another predetermined reference voltage assigned to an adjacent third amplifier circuit means included in subsequent stage with respect to said last mentioned second amplifier circuit means, and fourth amplifier circuit means comprising differential amplifier means having one input connected to said input terminal and another input connected to a juncture of said voltage divider circuit at still another predetermined reference voltage and a luminous display element which is energized upon the analogue input signal exceeding said still another predetermined reference voltage assigned to said fourth amplifier circuit means.

10. The circuit arrangement according to claim 9 in which said voltage divider circuit includes a current stabilizing element.

11. A circuit arrangement for digital display of an analogue input signal comprising an input terminal, a source of voltage, a voltage divider circuit across said source of voltage for deriving a plurality of reference voltages, first amplifier circuit means for energizing a luminous display element included therein upon the level of the analogue input signal falling below a predetermined value, and a plurality of second amplifier circuit means each comprising differential amplifier means having one input connected to said input terminal and another input connected to a juncture of said voltage divider circuit at a predetermined reference voltage and a luminous display element, said luminous display element of one of said second amplifier circuit means being energized upon the level of the input signal exceeding a predetermined reference voltage assigned to said one second amplifier circuit means and deenergized only upon the level of the input signal exceeding or falling below another predetermined reference voltage assigned to another second amplifier means comprising the next adjacent stage with respect to said one second amplifier means.

12. The circuit arrangement according to claim 11 in which said voltage divider circuit includes a current stabilizing element.

* * * * *